United States Patent [19]
Rogers

[11] 4,295,264
[45] Oct. 20, 1981

[54] METHOD OF MAKING INTEGRATED CIRCUIT MOS CAPACITOR USING IMPLANTED REGION TO CHANGE THRESHOLD

[75] Inventor: Gerald D. Rogers, Houston, Tex.

[73] Assignee: Texas Instruments Incorporated, Dallas, Tex.

[21] Appl. No.: 741,815

[22] Filed: Nov. 15, 1976

Related U.S. Application Data

[62] Division of Ser. No. 645,171, Dec. 29, 1975, abandoned.

[51] Int. Cl.³ .......................... H01L 7/44; B01J 17/00
[52] U.S. Cl. .................................. 29/571; 29/577 C; 29/576 B
[58] Field of Search ...................... 29/571, 577, 576 B, 29/25.42

[56] References Cited

U.S. PATENT DOCUMENTS 3,387,286  6/1968  Dennard .............................. 340/173
3,865,654  2/1975  Chang .................................. 29/571
3,889,358  6/1975  Bierhenke ............................ 29/571

Primary Examiner—Upendra Roy
Attorney, Agent, or Firm—John G. Graham

[57] ABSTRACT

An MOS capacitor for N-channel silicon gate integrated circuits employs a polycrystalline silicon layer as one plate, and a silicon oxide dielectric. The lower plate consists of a region which is implanted by an ion beam to produce a depleted region. This device has a constant capacitance regardless of gate voltage in normal operating logic levels.

4 Claims, 4 Drawing Figures

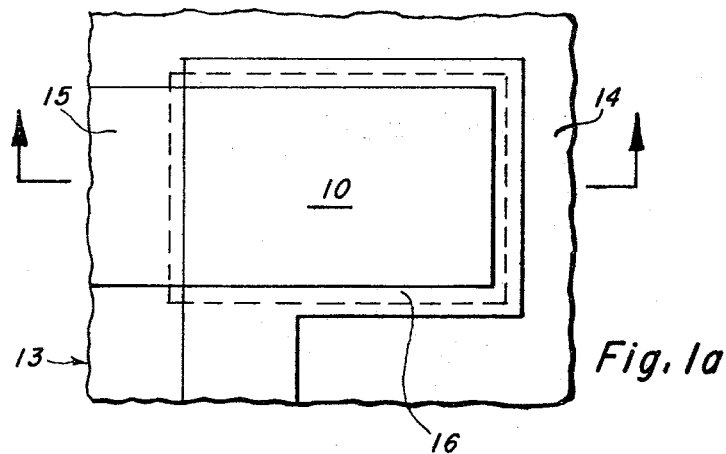
Fig. 1a
Fig. 1b
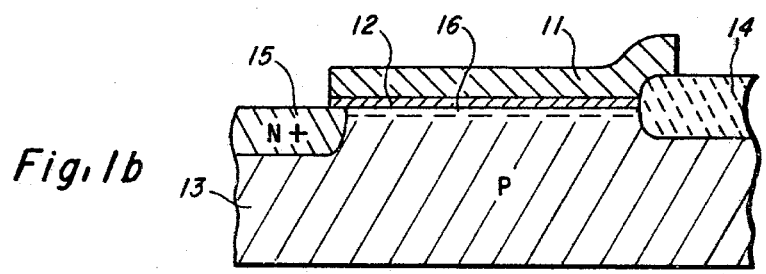
Fig. 2
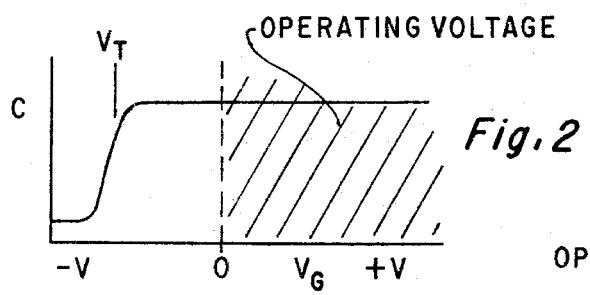
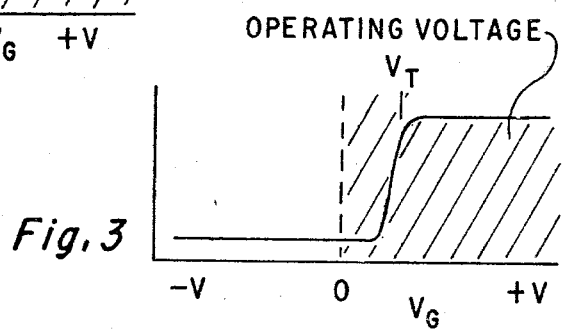
Fig. 3

4,295,264

METHOD OF MAKING INTEGRATED CIRCUIT MOS CAPACITOR USING IMPLANTED REGION TO CHANGE THRESHOLD

This is a division, of application Ser. No. 045,171, filed Dec. 29, 1975, now abandoned.

BACKGROUND OF THE INVENTION

This invention relates to semiconductor devices, and more particularly to capacitors for N-channel silicon gate integrated circuits.

Integrated circuits have long used silicon oxide dielectric or MOS capacitors as set forth in Kilby's U.S. Pat. No. 3,350,760, issued Nov. 7, 1967. The advantage of these devices is that a capacitor is created by the same fabrication steps used to make the other elements of the integrated circuit. In N-channel silicon gate circuits, so-called gated capacitors are often used, as for storage capacitors in RAM cells set forth in Electronics, Sept. 13, 1973, p. 116-121. These devices are of great utility, but it is sometimes a disadvantage that the capacitance is dependent on the voltage applied to the silicon gate and the adjacent diffused region of the device.

It is the object of this invention to provide an improved capacitor of the type used in integrated circuits, particularly N-channel silicon gate devices. Another object is to provide an MOS capacitor of the gated capacitor type wherein the voltage on the gate does not change the magnitude of capacitance. An additional object is to provide a capacitor which has the same value regardless of the polarity of voltage applied.

SUMMARY OF THE INVENTION

An MOS capacitor for N-channel silicon gate integrated circuits employs a polycrystalline silicon layer as one plate, and a silicon oxide dielectric. The lower plate consists of a region which is implanted by an ion beam to produce a a different threshold voltage. In one embodiment the implant produces depleted region. This device depletion has a constant capacitance regardless of gate voltage in normal operating logic levels.

THE DRAWINGS

The novel features believed characteristic of the invention are set forth in the appended claims. The invention itself, however, as well as other features and advantages thereof, will best be understood by reference to the following detailed description of a particular embodiment, when read in conjunction with the accompanying drawings, wherein:

FIG. 1a is a elevation view in section of a silicon bar containing the capacitor of the invention;

FIG. 1b is a plan view of the capacitor of FIG. 1a;

FIGS. 2 and 3 are graphs of capacitance vs. voltage for the device of FIGS. 1a and 1b.

DETAILED DESCRIPTION OF SPECIFIC EMBODIMENT

Referring to FIGS. 1a and 1b, a capacitor 10 according to the invention is illustrated. The capacitor includes an upper plate 11 which is composed of polycrystalline silicon, doped with phosphorus to be highly conductive. The capacitor dielectric is a thin layer 12 of silicon oxide, about 1000 Å in thickness, overlying a small area of the face of a monocrystalline silicon bar 13. Thick field oxide 14 exists a large part of the face of the bar, this oxide being about 10,000 Å. An N+ diffused region 15 of about 8,000 Å depth is provided in the face of the bar 13, as would usually provide the source and drain regions of MOS transistors as well as interconnections between components. An ion implanted region 16 is provided as the lower plate of the capacitor 10. The region 16 is contacted by the region 15 at its edge.

The device of FIGS. 1a and 1b is made by a process which begins with applying thin coatings of silicon oxide and nitride to a face of a P-type silicon slice, and the nitride is selectively removed using photoresist to expose the areas where thick oxide 14 is to be grown. The areas 15 and 16 are covered by nitride. When the oxide 14 is grown by exposing to an oxidizing atmosphere at high temperature, the surface of the silicon is consumed so the oxide is seen to extend into the face of the silicon. Next, the remaining nitride mask is removed and the slice is subjected to an ion implant operation wherein the region 16 is produced. Phosphorus atoms are implanted by an ion beam at about 150 KeV at a dosage of about $1 \times 10^{12}$ atoms/cm$^2$. Next, thin oxide layer 12 is grown, and the slice is coated with polysilicon which is patterned using photoresist to leave the layers 11 and 12. The slice is subjected to an N-type diffusion to create the region 15, using the layer 12 as a mask. The device is completed by covering with thick low temperature oxide, holes are opened in the oxide, and a metal interconnection pattern is provided by deposition of aluminum and photoresist patterning. The device is usually part of a complex integrated circuit which contains thousands of MOS transistors and other devices on a chip which is perhaps 150 to 200 mils on a side. The device of FIGS. 1a and 1b is only about five to ten mils squared in size, depending on the magnitude of capacitance needed.

FIG. 2 shows the capacitance per square mil for the device of FIGS. 1a and 1b, made as described above. Note that the threshold voltage is shifted to a negative value compared to FIG. 3 which is the equivalent graph of the device of FIGS. 1a and 1b without the ion implant region 16. The operating region of the device of FIG. 2 is in the shaded area because N-channel devices are operated at logic levels of Vss or ground to about +12 volts. In the embodiment device of FIG. 3, under zero logic levels the capacitance is markedly smaller than at one logic level. Another advantage of the device of FIG. 1a and 1b is that with certain constraints of operating voltage the capacitance between gate 11 and drain 15 is the same regardless of the polarity of connection; this was not true in enhancement device which were reponsive to having the drain connected to a given node.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making an MOS integrated circuit device having a capacitor comprising the steps of:
   a. providing a body of silicon having an area on a major face thereof for a capacitor device;

b. implanting a shallow surface-adjacent part of said area with conductivity-determining impurity to create a capacitor region in the surface of the silicon to function as the lower plate of the capacitor, the capacitor region being implanted to an impurity concentration selected to exhibit a threshold of the capacitor substantially different from that of the silicon not implanted whereby such region has a threshold less than zero volts;

c. providing a coating of silicon oxide on said area as the capacitor dielectric;

d. applying a layer of polycrystalline silicon over said coating of silicon oxide to provide the upper plate of the capacitor;

e. and diffusing impurity material into the major face near and on one side of said area to a depth much greater than that of said shallow surface-adjacent implanted part to provide electrical connections to the capacitor region, using said coating of silicon oxide as a mask.

2. A method according to claim 1 wherein the body is predominantly P-type.

3. A method according to claim 2 wherein the impurity material diffused into the major face is N-type.

4. A method according to claim 3 wherein the conductivity-determining impurity is phosphorus.

* * * * *